(12) United States Patent
Tamura et al.

(10) Patent No.: US 10,648,076 B2
(45) Date of Patent: May 12, 2020

(54) CLEANING METHOD AND FILM DEPOSITION APPARATUS EXECUTING THE CLEANING METHOD FOR UNIFORMLY CLEANING ROTARY TABLE

(71) Applicant: Tokyo Electron Limited, Tokyo (JP)

(72) Inventors: Tatsuya Tamura, Iwate (JP); Takahito Umehara, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/825,611

(22) Filed: Nov. 29, 2017

(65) Prior Publication Data
US 2018/0155829 A1 Jun. 7, 2018

(30) Foreign Application Priority Data
Dec. 6, 2016 (JP) ................... 2016-237074

(51) Int. Cl.
*B08B 3/04* (2006.01)
*C23C 16/44* (2006.01)
*C23C 22/34* (2006.01)
*C23C 14/50* (2006.01)
*C23C 16/458* (2006.01)
*C23C 16/455* (2006.01)
*C23C 16/40* (2006.01)

(52) U.S. Cl.
CPC ........ *C23C 16/4405* (2013.01); *C23C 14/505* (2013.01); *C23C 16/401* (2013.01); *C23C 16/458* (2013.01); *C23C 16/4584* (2013.01); *C23C 16/45548* (2013.01); *C23C 22/34* (2013.01)

(58) Field of Classification Search
CPC .................................. B08B 3/00; B08B 3/04
See application file for complete search history.

(56) References Cited

U.S. PATENT DOCUMENTS

| 4,786,352 A * | 11/1988 | Benzing | B08B 7/0035 134/1 |
| 5,788,778 A * | 8/1998 | Shang | B08B 7/0035 134/1 |
| 6,092,542 A * | 7/2000 | Matsuda | B08B 3/02 118/321 |
| 6,423,146 B1 * | 7/2002 | Fukazawa | B08B 3/02 134/2 |

(Continued)

FOREIGN PATENT DOCUMENTS

| JP | 2007-53154 | * | 3/2007 | ........... H01L 21/304 |
| JP | 2010-153805 | | 7/2010 | |

(Continued)

*Primary Examiner* — Bret P Chen
(74) *Attorney, Agent, or Firm* — IPUSA, PLLC (57) ABSTRACT

A method performed by a film deposition apparatus including a process chamber and a rotary table that is disposed in the process chamber and includes a substrate-mounting surface on which a substrate is placeable. The method includes a first cleaning process of supplying a cleaning gas from above the substrate-mounting surface of the rotary table while rotating the rotary table in a first cleaning position, and a second cleaning process of supplying the cleaning gas from above the substrate-mounting surface of the rotary table while rotating the rotary table in a second cleaning position that is lower than the first cleaning position.

8 Claims, 11 Drawing Sheets

(56) References Cited

U.S. PATENT DOCUMENTS

| | | | |
|---|---|---|---|
| 6,945,259 B2* | 9/2005 | Masui | B08B 3/08 |
| | | | 134/103.2 |
| 2003/0216041 A1* | 11/2003 | Herring | B08B 7/00 |
| | | | 438/689 |
| 2004/0093679 A1* | 5/2004 | Kukoff | A47L 13/16 |
| | | | 15/118 |
| 2007/0289609 A1* | 12/2007 | Lim | B08B 7/00 |
| | | | 134/22.1 |
| 2009/0023241 A1* | 1/2009 | Furuta | B08B 7/0035 |
| | | | 438/57 |
| 2009/0047447 A1* | 2/2009 | Sawin | B08B 7/0035 |
| | | | 427/575 |
| 2010/0122710 A1 | 5/2010 | Kato et al. | |
| 2010/0248458 A1* | 9/2010 | Mitani | C23C 16/54 |
| | | | 438/478 |
| 2012/0000490 A1 | 1/2012 | Chung et al. | |
| 2013/0174873 A1* | 7/2013 | Yoshihara | H05K 3/26 |
| | | | 134/19 |
| 2014/0069459 A1 | 3/2014 | Guan et al. | |
| 2014/0251535 A1* | 9/2014 | Ishii | H01L 21/67132 |
| | | | 156/281 |
| 2015/0050815 A1* | 2/2015 | Yanagisawa | C23C 16/455 |
| | | | 438/778 |

FOREIGN PATENT DOCUMENTS

| | | | | |
|---|---|---|---|---|
| JP | 2014-017322 | | 1/2014 | |
| KR | 10-2010-0056273 | | 5/2010 | |
| TW | 201433217 | | 8/2014 | |
| WO | WO 2016/153343 | * | 9/2016 | C23C 16/44 |

* cited by examiner

CLEANING METHOD AND FILM DEPOSITION APPARATUS EXECUTING THE CLEANING METHOD FOR UNIFORMLY CLEANING ROTARY TABLE

CROSS-REFERENCE TO RELATED APPLICATION

The present application is based upon and claims the benefit of priority of Japanese Patent Application No. 2016-237074, filed on Dec. 6, 2016, the entire contents of which are incorporated herein by reference.

BACKGROUND OF THE INVENTION

1. Field of the Invention

An aspect of this disclosure relates to a cleaning method and a film deposition apparatus.

2. Description of the Related Art

In a film deposition apparatus used for manufacturing semiconductor devices, a film is deposited not only on the upper surface of a substrate but also on the upper surface, the side surface, and the lower surface of a rotary table on which the substrate is placed. When the film deposited on the upper surface, the side surface, and the lower surface of the rotary table becomes thick, the film flakes off and forms particles. For this reason, a cleaning gas is routinely supplied into a process chamber to remove the film deposited on the upper surface, the side surface, and the lower surface of the rotary table (see, for example, Japanese Laid-Open Patent Publication No. 2010-153805).

With the related-art method, however, because the gap between a nozzle for supplying the cleaning gas and the rotary table is narrow, the flow rate of the cleaning gas supplied from the nozzle becomes high and most of the cleaning gas is ejected before the film deposited on the upper surface of the rotary table is removed. This in turn increases the cleaning time necessary to remove the film deposited on the upper surface of the rotary table, and causes the time necessary to remove the film to vary depending on surfaces of the rotary table.

SUMMARY OF THE INVENTION

In an aspect of this disclosure, there is provided a method performed by a film deposition apparatus including a process chamber and a rotary table that is disposed in the process chamber and includes a substrate-mounting surface on which a substrate is placeable. The method includes a first cleaning process of supplying a cleaning gas from above the substrate-mounting surface of the rotary table while rotating the rotary table in a first cleaning position, and a second cleaning process of supplying the cleaning gas from above the substrate-mounting surface of the rotary table while rotating the rotary table in a second cleaning position that is lower than the first cleaning position.

DESCRIPTION OF THE PREFERRED EMBODIMENTS

Embodiments of the present invention are described below with reference to the accompanying drawings. Throughout the specification and the drawings, the same reference number is assigned to substantially the same components, and repeated descriptions of those components are omitted.

<Film Deposition Apparatus>

Figure 1:
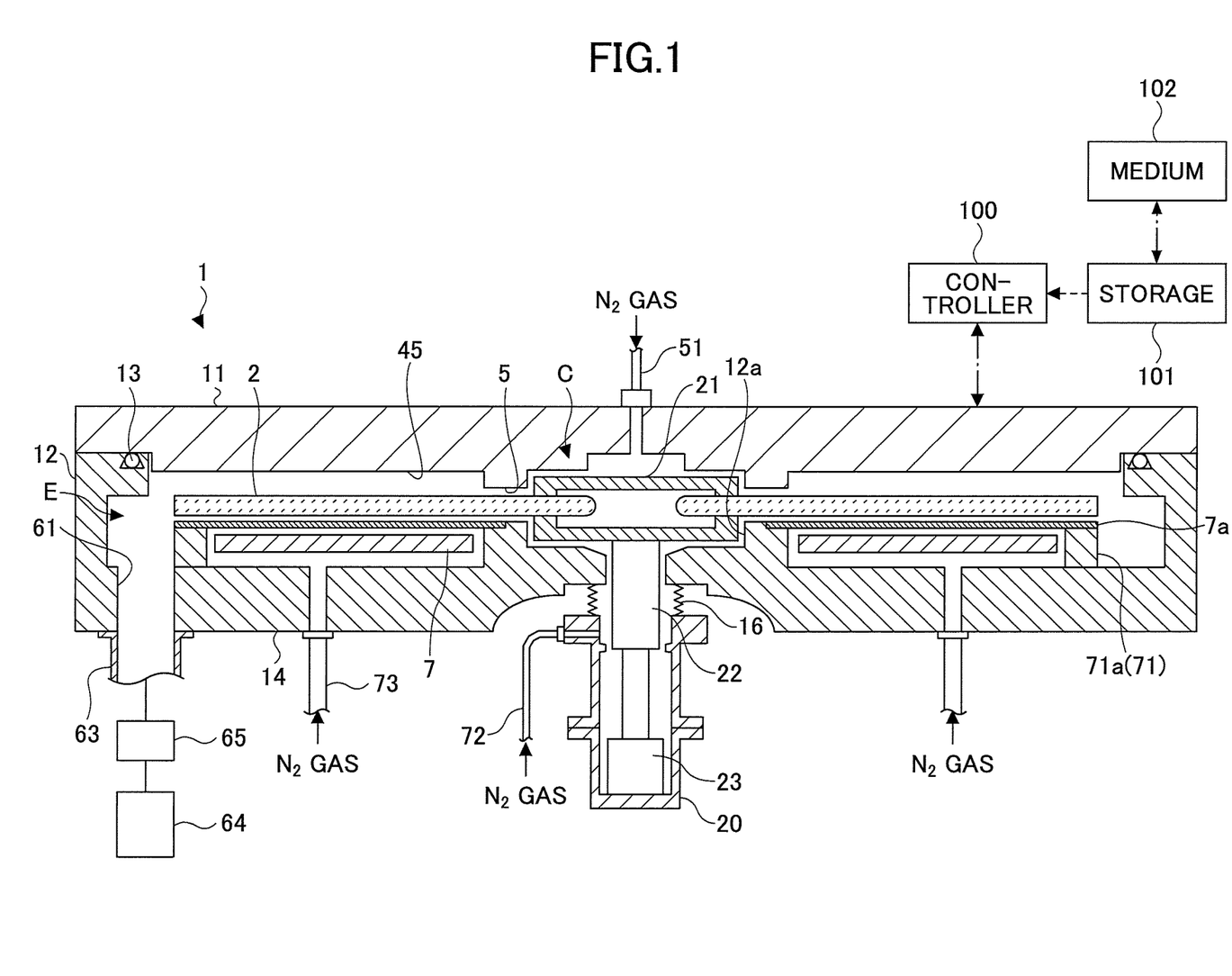
FIG. 1 is a cross-sectional view of a film deposition apparatus according to an embodiment.
Figure 2:
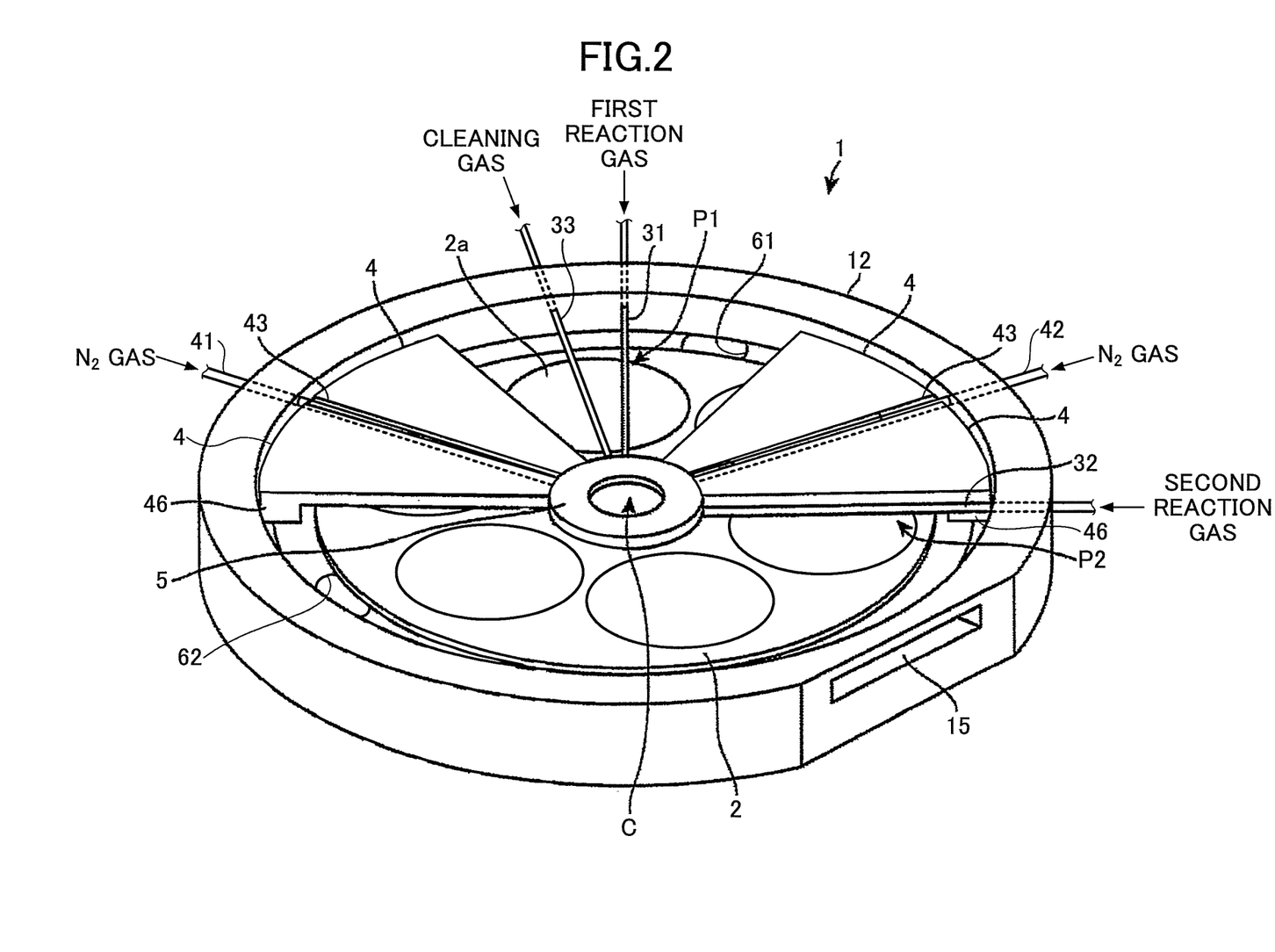
FIG. 2 is a perspective view of an internal configuration of a vacuum chamber of the film deposition apparatus of FIG. 1.
Figure 3:
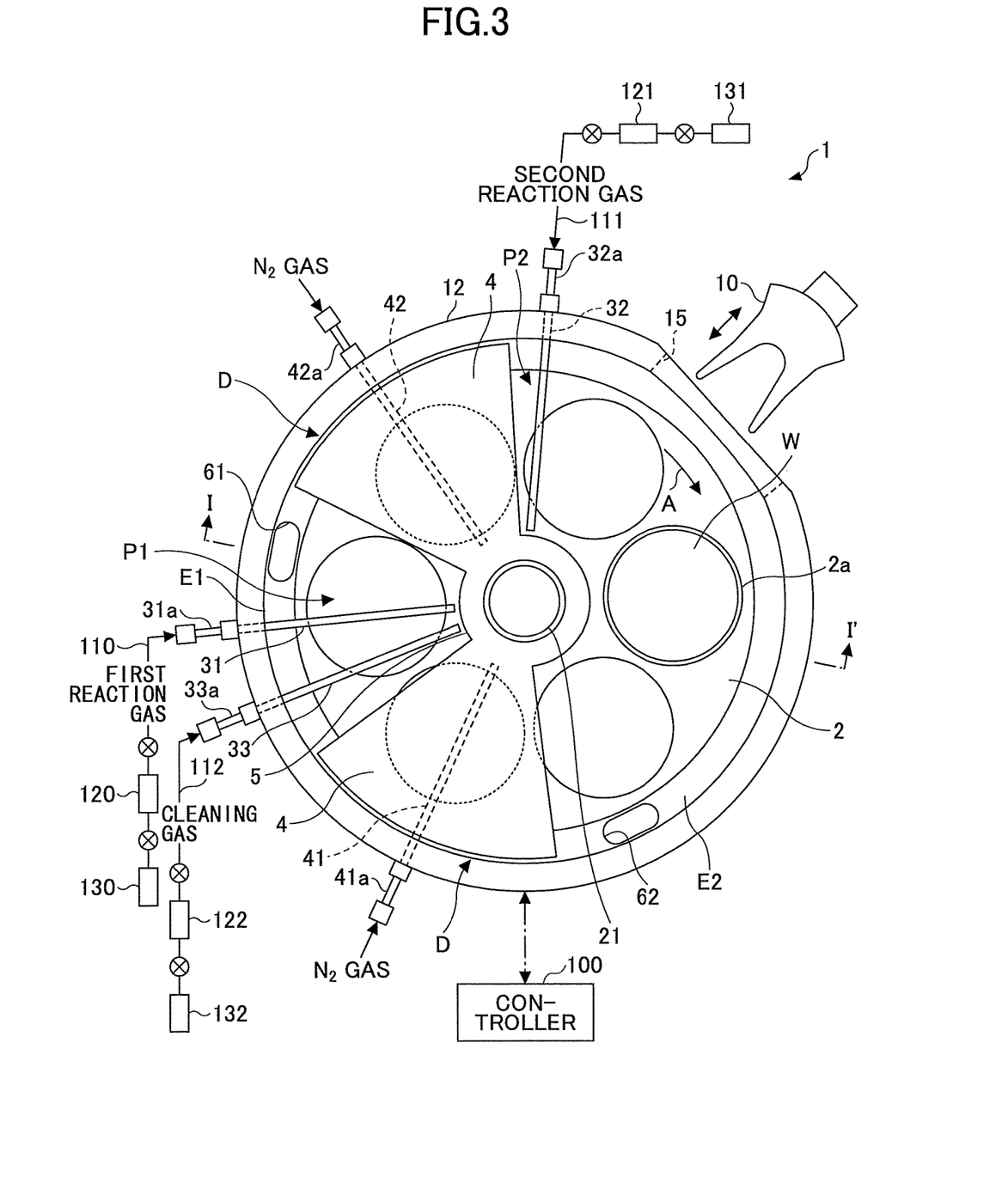
FIG. 3 is a plan view of the internal configuration of the vacuum chamber of the film deposition apparatus of FIG. 1.

An example of a film deposition apparatus that can perform cleaning methods according to embodiments of the present invention is described. FIG. 1 is a cross-sectional view of a film deposition apparatus according to an embodiment. FIG. 2 is a perspective view of an internal configuration of a vacuum chamber of the film deposition apparatus of FIG. 1. FIG. 3 is a plan view of the internal configuration of the vacuum chamber of the film deposition apparatus of FIG. 1. In FIGS. 2 and 3, a top plate 11 is omitted for illustration purposes.

As illustrated by FIGS. 1 through 3, the film deposition apparatus may include a vacuum chamber 1 having a substantially circular planar shape, and a rotary table 2 that is disposed in the vacuum chamber 1 such that the center of the vacuum chamber 1 matches the center of rotation of the rotary table 2. The vacuum chamber 1 is a process chamber where a film deposition process is performed on the upper surface of a semiconductor wafer (which is hereafter referred to as a "wafer W") that is a substrate. The vacuum chamber 1 may include a chamber body 12 shaped like a closed-end cylinder and a top plate 11 that is hermetically and detachably attached via a sealing part 13 such as an O-ring to the upper surface of the chamber body 12.

The rotary table 2 is rotatably disposed in the vacuum chamber 1. The rotary table 2 may be formed of, for example, quartz. A central portion of the rotary table 2 is fixed to a core 21 having a cylindrical shape. The core 21 is fixed to an upper end of a rotational shaft 22 that extends in the vertical direction. The rotational shaft 22 passes through a bottom 14 of the vacuum chamber 1, and a lower end of the rotational shaft 22 is attached to a drive unit 23. The drive unit 23 includes, for example, a pneumatic cylinder and a stepping motor. The drive unit 23 moves the rotational shaft 22 up and down and thereby moves the rotary table up and down. Also, the drive unit 23 rotates the rotational shaft 22 about a vertical axis and thereby rotates the rotary table 2. The rotational shaft 22 and the drive unit 23 are housed in a tubular case 20 with an opening at the upper end. A flange formed at the upper end of the case 20 is hermetically attached to a lower surface of the bottom 14 of the vacuum chamber 1 via a bellows 16 that is expandable and contractible in the vertical direction such that the internal atmosphere of the case 20 is isolated from the external atmosphere. Because the bellows 16 expands and contracts as the rotary table 2 moves up and down, the internal atmosphere of the case 20 can be kept isolated from the external atmosphere.

As illustrated in FIGS. 2 and 3, multiple (six in this example) circular recesses 2a for holding wafers W are formed in the upper surface of the rotary table 2. The recesses 2a are arranged along the rotational direction (or the circumferential direction) of the rotary table 2. In FIG. 3, for brevity, the wafer W is illustrated only in one of the recesses 2a. Each recess 2a has an inside diameter that is slightly (e.g., by 4 mm) greater than the diameter of the wafer W, and has a depth that is substantially the same as the thickness of the wafer W. Accordingly, when the wafer W is placed in the recess 2a, the height of the upper surface of the wafer W becomes substantially the same as the height of the upper surface (in an area where no recess 2a is formed) of the rotary table 2. Through holes (not shown) are formed in the bottom of each recess 2a. For example, three elevating pins (not shown) pass through the through holes to support the lower surface of the wafer W and move the wafer W up and down.

As illustrated in FIGS. 2 and 3, reaction gas nozzles 31 and 32, a cleaning gas nozzle 33, and separation gas nozzles 41 and 42, which are formed of, for example, quartz, are provided above the rotary table and arranged at intervals along the circumferential direction of the vacuum chamber 1. In this example, the separation gas nozzle 41, the cleaning gas nozzle 33, the reaction gas nozzle 31, the separation gas nozzle 42, and the reaction gas nozzle 32 are arranged clockwise (along the rotational direction of the rotary table 2) in this order from a transfer port 15. The nozzles 31, 32, 33, 41, and 42 are inserted through an outer wall of the chamber body 12 into the vacuum chamber 1 such that the nozzles 31, 32, 33, 41, and 42, extend in the radial direction of the chamber body 12 in parallel with the upper surface of the rotary table 2. Gas introduction ports 31a, 32a, 33a, 41a, and 42a (see FIG. 3) at the ends of the nozzles 31, 32, 33, 41, and 42 are fixed to the outer wall of the chamber body 12.

In the present embodiment, as illustrated in FIG. 3, the reaction gas nozzle 31 is connected via a pipe 110 and a flow rate controller 120 to a first reaction gas supply source 130 for supplying a first reaction gas. The reaction gas nozzle 32 is connected via a pipe 111 and a flow rate controller 121 to a second reaction gas supply source 131 for supplying a second reaction gas. The cleaning gas nozzle 33 is connected via a pipe 112 and a flow rate controller 122 to a cleaning gas supply source 132 for supplying a cleaning gas. The separation gas nozzles 41 and 42 are connected via pipes and flow rate control valves (not shown) to separation gas supply sources (not shown) for supplying a separation gas. Examples of separation gases include noble gases such as a helium (He) gas and an argon (Ar) gas and inactive gases such as a nitrogen ($N_2$) gas. In the present embodiment, an $N_2$ gas is used as an example of the separation gas.

Each of the reaction gas nozzles 31 and 32 includes multiple gas discharge holes 35 (see FIG. 4) that are open toward the rotary table 2 and arranged at an interval of, for example, 10 mm along the longitudinal direction of the respective reaction gas nozzles 31 and 32. A region below the reaction gas nozzle 31 is a first process region P1 where the first reaction gas is adsorbed onto the wafer W. A region below the reaction gas nozzle 32 is a second process region P2 where the second reaction gas, which reacts with the first reaction gas adsorbed onto the wafer W in the first process region P1, is supplied to form a molecular layer of a reaction product. The molecular layer of the reaction product constitutes a film to be deposited (or formed).

The first reaction gas may be any type of gas. Generally, a material gas of a film to be formed is selected as the first reaction gas. For example, when a silicon dioxide film is to be formed, a silicon-containing gas such as a Bis(tertiary-butylamino)silane (BTBAS) gas is selected as the first reaction gas.

The second reaction gas may be any type of reaction gas that can react with the first reaction gas to form a reaction product. For example, when a silicon dioxide film is to be formed, an oxide gas such as an ozone ($O_3$) gas is selected as the second reaction gas.

The cleaning gas nozzle 33 is used when a cleaning process is performed. Similarly to the reaction gas nozzles 31 and 32, the cleaning gas nozzle 33 includes multiple gas discharge holes (not shown) that are open toward the rotary table 2 and arranged at an interval of, for example, 10 mm along the longitudinal direction of the cleaning gas nozzle 33. In this example, the cleaning gas nozzle 33 supplies a cleaning gas to the first process region P1. Also, the cleaning gas nozzle 33 may be provided in a position where the cleaning gas nozzle 33 can supply the cleaning gas to the second process region P2. Further, the cleaning gas nozzle 33 may be provided both in a position where the cleaning gas nozzle 33 can supply the cleaning gas to the first process region P1 and a position where the cleaning gas nozzle 33 can supply the cleaning gas to the second process region P2. The cleaning gas may be any type of gas. For example, when used to remove a silicon dioxide film, a fluorine-containing gas such as chlorine fluoride ($ClF_3$) or nitrogen trifluoride ($NF_3$) is selected as the cleaning gas. Also, a combination of these gases may be used.

As illustrated in FIGS. 2 and 3, two protruding parts 4 are provided in the vacuum chamber 1. The protruding parts 4 form separation regions D together with the separation gas nozzles 41 and 42. The protruding parts 4 are attached to the lower surface of the top plate 11 to protrude toward the rotary table 2. Each protruding part 4 has a fan-like planar shape whose apex is cut off to form an arc. The protruding part 4 is disposed such that its inner arc is connected to a protrusion 5 (described later), and its outer arc extends along the inner circumferential surface of the chamber body 12 of the vacuum chamber 1.

Figure 4:
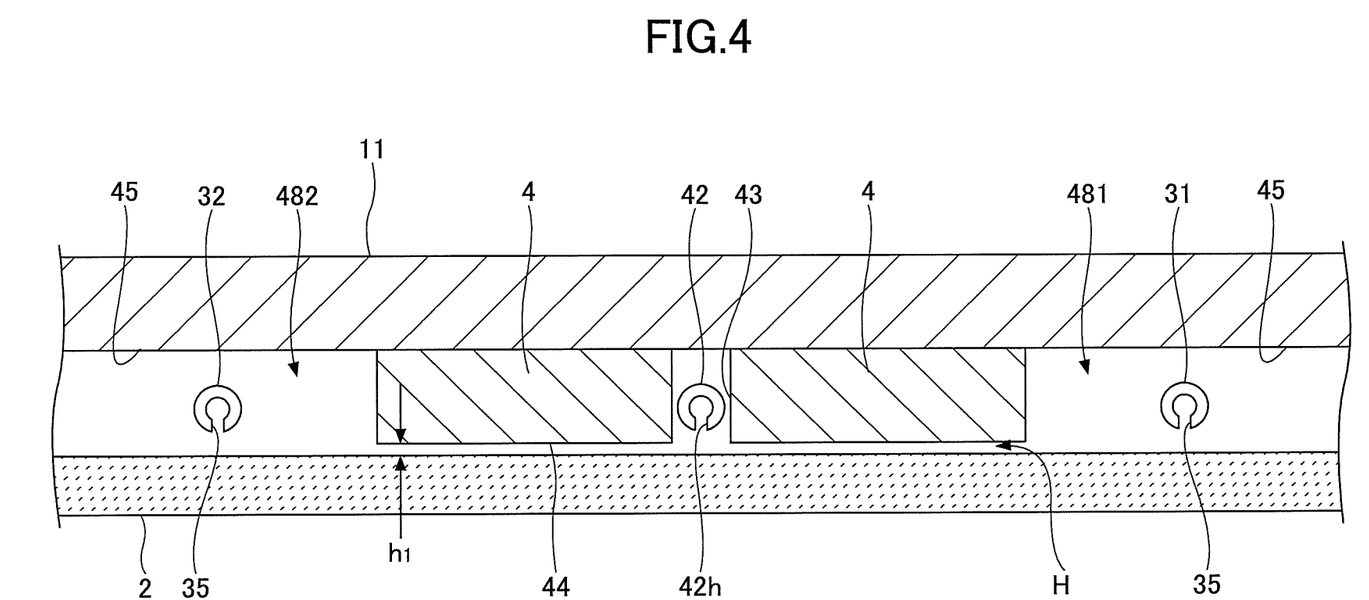
FIG. 4 is a cross-sectional view of the vacuum chamber taken along a concentric circle of a rotary table of the film deposition apparatus of FIG. 1.

FIG. 4 is a cross-sectional view of a part of the vacuum chamber 1 from the reaction gas nozzle 31 to the reaction gas nozzle 32, which is taken along a concentric circle of the rotary table 2 of the film deposition apparatus of FIG. 1. In FIG. 4, for illustration purposes, the wafer W is omitted.

As illustrated in FIG. 4, the protruding part 4 is attached to the lower surface of the top plate 11. Accordingly, in the vacuum chamber 1, a flat and lower ceiling surface (first ceiling surface) 44 is formed by the lower surface of the protruding part 4, and a higher ceiling surface (second ceiling surface) 45 is formed by the lower surface of the top plate 11. The second ceiling surface 45 is located on both sides of the first ceiling surface 44 in the circumferential direction, and is at a higher position than the first ceiling surface 44. The first ceiling surface 44 has a fan-like planar shape whose apex is cut off to form an arc. Also, as illustrated in FIG. 4, a groove 43 extending in the radial direction is formed in the middle of the protruding part 4 in the circumferential direction. The separation gas nozzle 42 is placed in the groove 43. A groove 43 is also formed in the other protruding part 4, and the separation gas nozzle 41 is placed in the groove 43. The reaction gas nozzles 31 and 32 are provided in spaces below the second ceiling surface 45. The reaction gas nozzles 31 and 32 are positioned apart from the second ceiling surface 45 and close to the wafer W. As illustrated in FIG. 4, the reaction gas nozzle 31 is provided in a space 481 that is below the second ceiling surface 45 and on the right side of the protruding part 4, and the reaction gas nozzle 32 is provided in a space 482 that is below the second ceiling surface 45 and on the left side of the protruding part 4.

Each of the separation gas nozzles 41 and 42 placed in the groove 43 of the protruding part 4 includes multiple gas discharge holes 42h (see FIG. 4) that are open toward the rotary table 2 and arranged at an interval of, for example, 10 mm along the longitudinal direction of the respective separation gas nozzles 41 and 42.

A narrow separation space H is formed between the first ceiling surface 44 and the upper surface of the rotary table 2. When an $N_2$ gas is supplied from the gas discharge holes 42h of the separation gas nozzle 42, the $N_2$ gas flows through the separation space H into the spaces 481 and 482. Because the volume of the separation space H is less than the volumes of the spaces 481 and 482, the pressure in the separation space H can be made higher than the pressures in the spaces 481 and 482 by supplying the $N_2$ gas. Thus, the separation space H with a high pressure is formed between the spaces 481 and 482. Also, the flow of the $N_2$ gas from the separation space H into the spaces 481 and 482 functions as a counter flow to the first reaction gas from the first process region P1 and the second reaction gas from the second process region P2. Accordingly, the separation space H separates the first reaction gas from the first process region P1 and the second reaction gas from the second process region P2. This configuration prevents the first reaction gas from mixing and reacting with the second reaction gas in the vacuum chamber 1.

A height h1 of the first ceiling surface 44 from the upper surface of the rotary table 2 is preferably determined based on the pressure in the vacuum chamber 1, the rotational speed of the rotary table 2, and/or the amount of supplied separation gas during a film forming process so that the pressure in the separation space H becomes higher than the pressures in the spaces 481 and 482.

A protrusion 5 (see FIGS. 2 and 3) is formed on the lower surface of the top plate 11 to surround the core 21 to which the rotary table 2 is fixed. In the present embodiment, the protrusion 5 is connected to the center-side ends of the protruding parts 4. The lower surface of the protrusion 5 is at the same height as the first ceiling surface 44.

Figure 5:
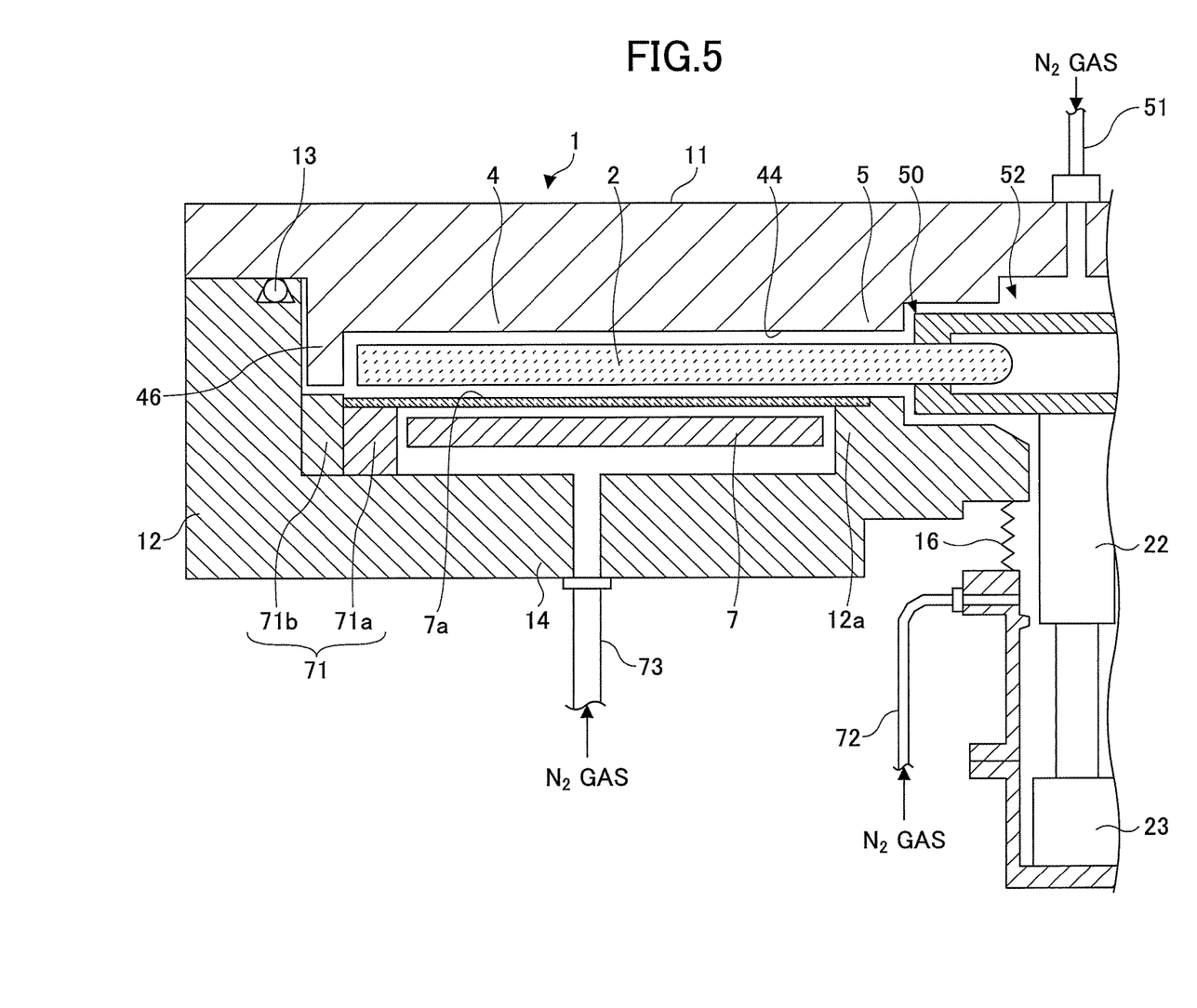
FIG. 5 is a cross-sectional view of a separation region of the film deposition apparatus of FIG. 1.

FIG. 1 is a cross-sectional view of the film deposition apparatus taken along line I-I' of FIG. 3 and illustrates a section including the second ceiling surface 45. In contrast, FIG. 5 is a cross-sectional view of another section of the film deposition apparatus including the first ceiling surface 44. As illustrated in FIG. 5, an L-shaped bent part 46 is formed at the periphery of each protruding part 4 (i.e., an end of the protruding part 4 that is closer to the outer wall of the vacuum chamber 1). The bent part 46 faces the outer end face of the rotary table 2. Similarly to the protruding part 4, the bent part 46 prevents the first and second reaction gases from entering the separation region D and thereby prevents the first and second reaction gases from being mixed with each other. The protruding part 4 is provided on the top plate 11, and the top plate 11 is detachable from the chamber body 12. Therefore, a small gap is provided between the outer surface of the bent part 46 and the chamber body 12. The gap between the inner surface of the bent part 46 and the outer end face of the rotary table 2 and the gap between the outer surface of the bent part 46 and the chamber body 12 may be set at a value that is substantially the same as the height of the first ceiling surface 44 from the upper surface of the rotary table 2.

As illustrated in FIG. 5, in the separation region D, the inner surface of the chamber body 12 is a vertical surface disposed close to the outer surface of the bent part 46. In contrast, as illustrated in FIG. 1, in regions other than the separation region D, a portion of the inner surface of the chamber body 12, which extends from a position facing the outer end face of the rotary table 2 to the bottom 14, is recessed outward. The recessed portion has a substantially-rectangular cross-sectional shape, and is referred to as an evacuation region in the descriptions below. More specifically, an evacuation region communicating with the first process region P1 is referred to as a first evacuation region E1, and an evacuation region communicating with the second process region P2 is referred to as a second evacuation region E2. As illustrated in FIGS. 1 through 3, a first evacuation port 61 is formed in the bottom of the first evacuation region E1, and a second evacuation port 62 is formed in the bottom of the second evacuation region E2. As illustrated in FIG. 1, each of the first evacuation port 61 and the second evacuation port 62 is connected via an evacuation pipe 63 to a vacuum pump 64 that is a vacuum evacuator. Also, a pressure controller 65 is provided between the vacuum pump 64 and the evacuation pipe 63.

As illustrated in FIGS. 1 and 5, a heater unit 7 is provided in a space between the rotary table 2 and the bottom 14 of the vacuum chamber 1. The heater unit 7 heats, via the rotary table 2, the wafer W on the rotary table 2 to a temperature defined by a process recipe. A ring-shaped cover 71 (see FIG. 5) is provided below and near the outer edge of the rotary table 2. The cover 71 separates an atmosphere in a space above the rotary table 2 and in the first and second evacuation regions E1 and E2 from an atmosphere in a space where the heater unit 7 is provided, and thereby prevents gases from entering a region below the rotary table 2. The cover 71 includes an inner part 71a and an outer part 71b. The inner part 71a is provided below the rotary table 2 and faces the outer edge of the rotary table 2 and a space surrounding the outer edge of the rotary table 2. The outer part 71b is provided between the inner part 71a and the inner surface of the vacuum chamber 1. The outer part 71b is disposed below the bent part 46 formed at the outer end of the protruding part 4 in the separation region D. The upper end of the outer part 71b is positioned close to the lower end of the bent part 46. The inner part 71a is disposed below the outer edge of the rotary table 2 (and below a space surrounding the outer edge of the rotary table 2) and surrounds the entire circumference of the heater unit 7.

A portion of the bottom 14, which is closer to the center of rotation than the space housing the heater unit 7, protrudes upward toward the core 21 and the central portion of the lower surface of the rotary table 2, and forms a protrusion 12a. A narrow space is formed between the protrusion 12a and the core 21. Also, a narrow space is formed between the rotational shaft 22 and the inner surface of a through hole formed in the bottom 14 for the rotational shaft 22. These narrow spaces communicate with the case 20. A purge gas supply pipe 72 is connected to the case 20. The purge gas supply pipe 72 supplies an $N_2$ gas as a purge gas to purge the narrow spaces. Also, purge gas supply pipes 73 are connected to the bottom 14 of the vacuum chamber 1 at positions below the heater unit 7 (only one purge gas supply pipe 73 is illustrated in FIG. 5). The purge gas supply pipes 73 are arranged in the circumferential direction at predetermined angular intervals and used to purge the space housing the heater unit 7. A lid 7a is provided between the heater unit 7 and the rotary table 2 to prevent entry of gases into the space housing the heater unit 7. The lid 7a covers an area along the circumferential direction and between the inner surface of the outer part 71b (or the upper surface of the inner part 71a) and the upper end of the protrusion 12a. The lid 7a may be formed of, for example, quartz.

A separation gas supply pipe 51 is connected to a central portion of the top plate 11 of the vacuum chamber 1, and supplies an $N_2$ gas as a separation gas into a space 52 between the top plate 11 and the core 21. The separation gas supplied into the space 52 flows through a narrow space 50 between the protrusion 5 and the rotary table 2, and flows toward the periphery of the rotary table 2 along the upper surface of the rotary table 2 on which the wafer W is placed. Due to the separation gas, the pressure in the space 50 is kept higher than the pressures in the space 481 and the space 482. Accordingly, the space 50 prevents the first reaction gas (e.g., a BTBAS gas) supplied into the first process region P1 and the second reaction gas (e.g., an $O_3$ gas) supplied into the second process region P2 from passing through a central region C and mixing with each other. That is, the space 50 (or the central region C) functions in a manner similar to the separation space H (or the separation region D).

As illustrated in FIGS. 2 and 3, a transfer port 15 is formed in the side wall of the vacuum chamber 1. The transfer port 15 is used to transfer the wafer W between an external conveying arm 10 (see FIG. 3) and the rotary table 2. The transfer port 15 is opened and closed by a gate valve (not shown). The wafer W is transferred between the recess 2a of the rotary table 2 and the conveying arm 10 when the recess 2a is at a position (transfer position) facing the transfer port 15. Elevating pins and an elevating mechanism (not shown) for lifting the wafer W are provided at the transfer position below the rotary table 2. The elevating pins pass through the recess 2a and push the lower surface of the wafer W upward.

As illustrated in FIG. 1, the film deposition apparatus of the present embodiment also includes a controller 100 implemented by a computer for controlling operations of the entire film deposition apparatus. A memory of the controller 100 stores a program according to which the controller 100 controls the film deposition apparatus to perform a cleaning method described later. The program includes steps corresponding to the cleaning method. The program is stored in a medium 102 such as a hard disk, a compact disk, a magneto-optical disk, a memory card, or a flexible disk, is read by a reading device into a storage 101, and installed in the controller 100.

<Film Deposition Method>

A film deposition method (or a film deposition process) according to an embodiment is described below. In the descriptions below, it is assumed that a silicon dioxide film is formed.

First, the rotary table 2 is rotated such that the recess 2a is positioned to face the transfer port 15 (see FIGS. 2 and 3), and then the gate valve (not shown) is opened. Next, the wafer W is carried by the conveying arm 10 through the transfer port 15 into the vacuum chamber 1. The wafer W is received by the elevating pins (not shown). After the conveying arm 10 is pulled out of the vacuum chamber 1, the elevating pins are lowered by the elevating mechanism (not shown), and the wafer W is placed in the recess 2a. The above "carry-in" process is repeated six times to place six wafers W in the corresponding recesses 2a.

Next, an $N_2$ gas is supplied from the separation gas nozzles 41 and 42, the separation gas supply pipe 51, and the purge gas supply pipes 72 and 73, and the inside of the vacuum chamber 1 is maintained at a predetermined pressure by the vacuum pump 64 and the pressure controller 65 (see FIG. 1). Also, the rotary table 2 is rotated, for example, clockwise (in a direction indicated by an arrow A in FIG. 3) at a predetermined speed. The rotary table 2 is heated in advance by the heater unit 7 to a predetermined temperature and as a result, the wafers W on the rotary table 2 are heated. After the wafers W are heated and maintained at a predetermined temperature, a BTBAS gas is supplied by the reaction gas nozzle 31 to the first process region P1, and an $O_3$ gas is supplied by the reaction gas nozzle 32 to the second process region P2.

When each wafer W passes through the first process region P1 below the reaction gas nozzle 31, BTBAS molecules are adsorbed on the surface of the wafer W. Also, when the wafer W passes through the second process region P2 below the reaction gas nozzle 32, $O_3$ molecules are adsorbed on the surface of the wafer W, and the BTBAS molecules are oxidized by $O_3$. Accordingly, when the wafer W passes through the first process region P1 and the second process region P2 once as the rotary table 2 rotates, one molecular layer (or two or more molecular layers) of silicon dioxide is formed on the surface of the wafer W. The wafer W alternately passes through the first process region P1 and the second process region P2 multiple times until a silicon dioxide film with a predetermined thickness is deposited on the surface of the wafer W. After the silicon dioxide film with the predetermined thickness is deposited on the wafer W, supply of the BTBAS gas and the $O_3$ gas is stopped, and the rotation of the rotary table 2 is stopped. Then, through a reverse process of the carry-in process, the wafers W are carried out of the vacuum chamber 1 by the conveying arm 10, and the film deposition process ends.

Thus, the above film deposition process can form a silicon dioxide film that is a reaction product of the BTBAS gas and the $O_3$ gas on the surface of the wafer W.

In the film deposition process, not only the surface of the wafer W but also the upper surface, the side surface, and the lower surface of the rotary table are exposed to the gases. Accordingly, a reaction product such as a silicon dioxide film is formed not only on the surface of the wafer W but also on the upper surface, the side surface, and the lower surface of the rotary table 2. When the film of a reaction product such as a silicon dioxide film formed on the upper surface, the side surface, and the lower surface of the rotary table 2 becomes thick, the film flakes off and forms particles. If such particles are generated in the vacuum chamber 1, the particles are introduced into a silicon dioxide film formed on the surface of the wafer W, and the quality of the silicon dioxide film is reduced.

For this reason, a cleaning process is generally performed, for example, when a film of a reaction product formed on the upper surface of the rotary table 2 reaches a predetermined thickness, when the amount of particles in a silicon dioxide film formed on the wafer W exceeds a predetermined value, or when the continuous operation time exceeds a predetermined value.

With this method, however, when the gap between a nozzle for supplying a cleaning gas and a rotary table is narrow, the flow rate of the cleaning gas supplied from the nozzle becomes high and most of the cleaning gas is ejected before a film deposited on the upper surface of the rotary table is removed. This in turn increases a cleaning time necessary to remove the film deposited on the upper surface of the rotary table, and causes the time necessary to remove the film to vary depending on surfaces of the rotary table.

Below, a cleaning method according to an embodiment is described. The cleaning method of the embodiment can reduce the cleaning time and can uniformly clean the rotary table 2.

<Cleaning Method>

A cleaning method according to an embodiment is described below. The cleaning method of the present embodiment includes two cleaning processes (a first cleaning process and a second cleaning process) that are performed while changing the position of the rotary table 2 in the vertical direction. In the first cleaning process, a cleaning gas is supplied from above a substrate-mounting surface of the rotary table 2 while rotating the rotary table 2 in a first cleaning position in the vacuum chamber 1. In the second cleaning process, a cleaning gas is supplied from above the substrate-mounting surface of the rotary table 2 while rotating the rotary table 2 in a second cleaning position lower than the first cleaning position. Either the same cleaning gas or different cleaning gases may be used in the first cleaning process and the second cleaning process.

Figure 6:
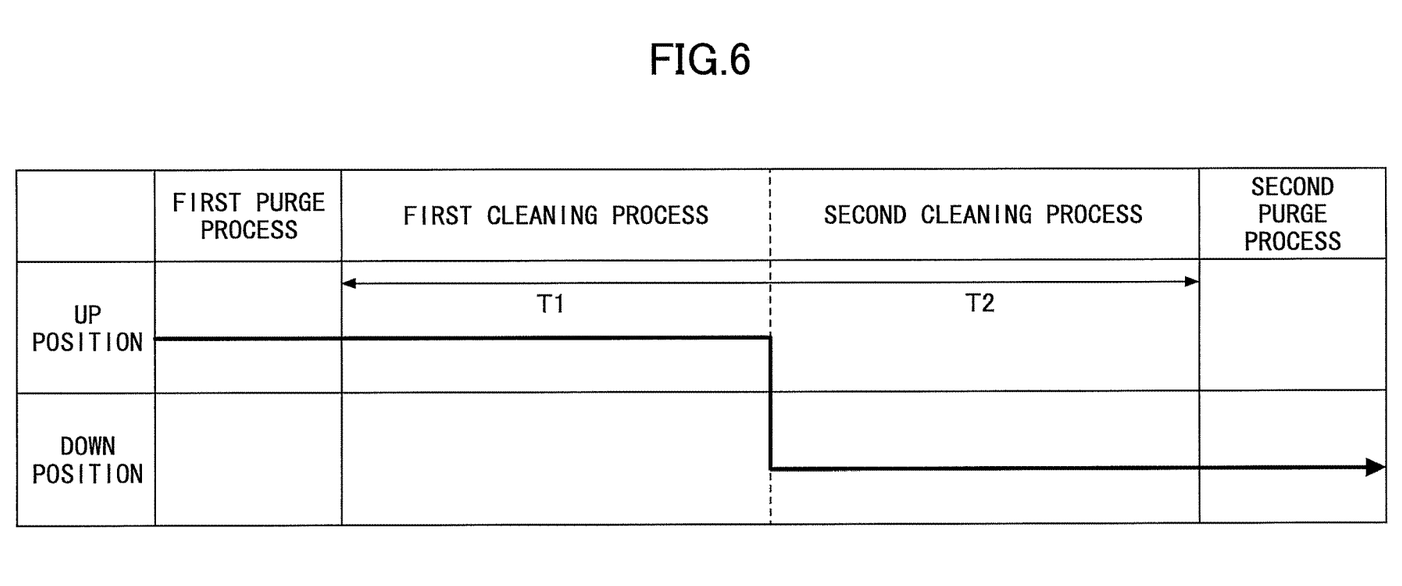
FIG. 6 is a timing chart illustrating an example of a cleaning method according to an embodiment.
Figure 7:
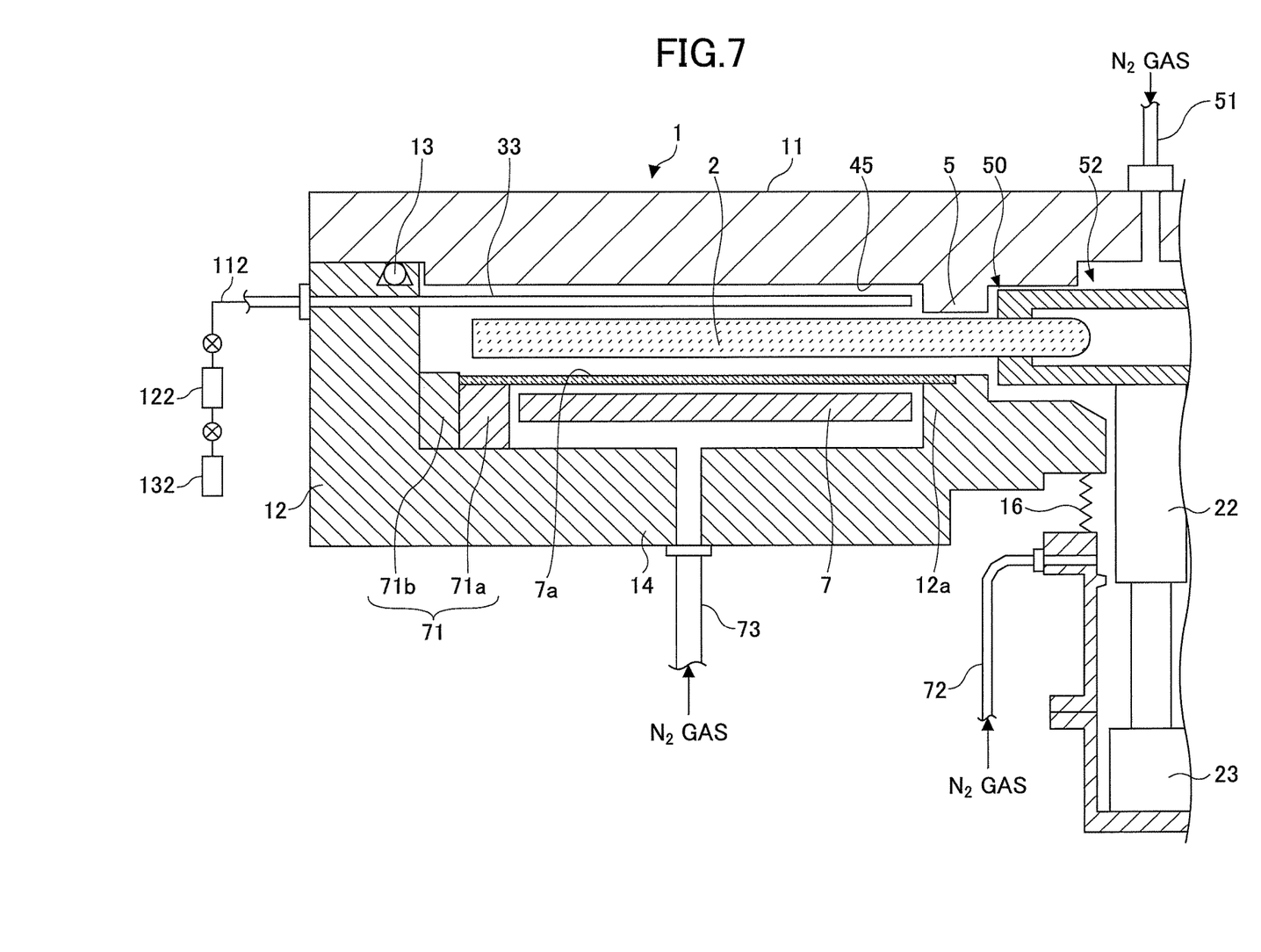
FIG. 7 is a cross-sectional view of the film deposition apparatus of FIG. 1 where the rotary table is in an up position.
Figure 8:
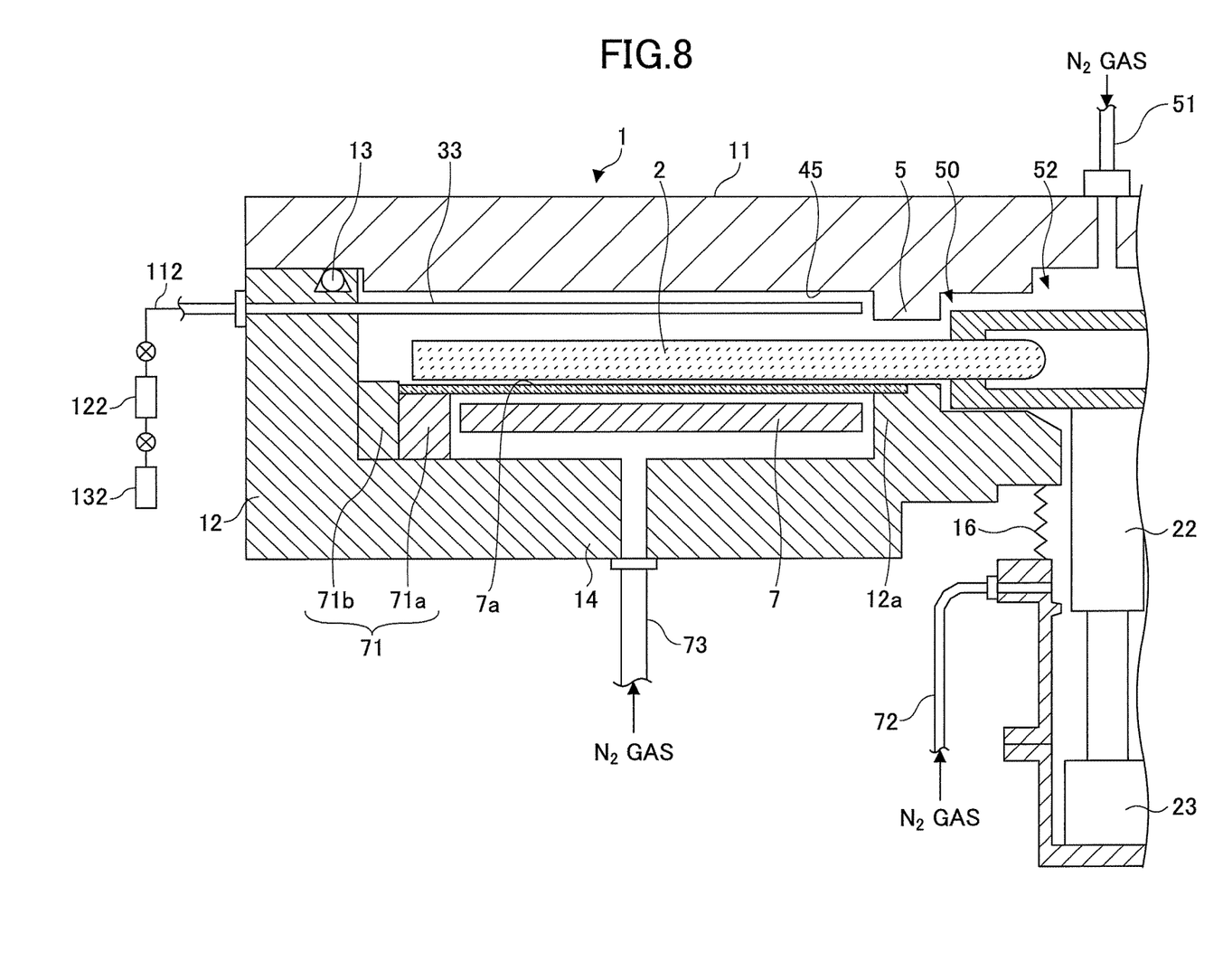
FIG. 8 is a cross-sectional view of the film deposition apparatus of FIG. 1 where the rotary table is in a down position.

In the descriptions below, it is assumed that a process of forming a silicon dioxide film has been performed according to the film deposition method described above, and a reaction product such as a silicon dioxide film deposited on the upper surface, the side surface, and the lower surface of the rotary table 2 during the film forming process is to be removed. FIG. 6 is a timing chart illustrating an exemplary cleaning method according to the present embodiment. FIGS. 7 and 8 are cross-sectional views of the film deposition apparatus of FIG. 1 and used to describe operations to move the rotary table 2 up and down. FIG. 7 illustrates a state where the rotary table 2 is in an up position, and FIG. 8 illustrates a state where the rotary table 2 is in a down position.

As illustrated in FIG. 6, the cleaning method of the present embodiment includes a first purge process, a first cleaning process, a second cleaning process, and a second purge process that are performed in this order. The first purge process and the second purge process may be omitted.

In the first purge process, while no wafer W is in the recesses 2a of the rotary table 2, the rotary table 2 is moved by the drive unit 23 to an up position, and an $N_2$ gas is supplied from the separation gas nozzles 41 and 42, the separation gas supply pipe 51, and the purge gas supply pipes 72 and 73. During the first purge process, the inside of the vacuum chamber 1 is maintained at a predetermined pressure by the vacuum pump 64 and the pressure controller 65. As a result, an $N_2$ gas atmosphere is formed in the vacuum chamber 1.

Next, in the first cleaning process, as illustrated by FIG. 7, the rotary table 2 is kept in the up position and rotated at a predetermined speed, and a $ClF_3$ gas is supplied from the cleaning gas nozzle 33 to the first process region P1. After a first time period T1 passes, the supply of the $ClF_3$ gas is stopped. The first time period T1 may be determined based on the thickness of a reaction product deposited on the upper surface, the side surface, and the lower surface of the rotary table 2.

Next, in the second cleaning process, as illustrated by FIG. 8, the rotary table 2 is moved to the down position by the drive unit 23 and rotated at a predetermined speed in the down position, and the $ClF_3$ gas is supplied from the cleaning gas nozzle 33 to the first process region P1. The down position is located lower than the up position. After a second time period T2 passes, the supply of the $ClF_3$ gas is stopped. The second time period T2 may be determined based on the thickness of a reaction product deposited on the upper surface, the side surface, and the lower surface of the rotary table 2.

Next, in the second purge process, while the rotary table 2 is kept in the down position, the $N_2$ gas is supplied from the separation gas nozzles 41 and 42, the separation gas supply pipe 51, and the purge gas supply pipes 72 and 73. During the second purge process, the inside of the vacuum chamber 1 is maintained at a predetermined pressure by the vacuum pump 64 and the pressure controller 65. After a predetermined period of time, the supply of the $N_2$ gas from the separation gas nozzles 41 and 42, the separation gas supply pipe 51, and the purge gas supply pipes 72 and 73 is stopped, and the entire cleaning process ends.

In the cleaning method of the present embodiment, the cleaning gas is supplied into the vacuum chamber 1 while the rotary table 2 is kept at two different positions (the up position and the down position) in the vertical direction to clean the upper surface, the side surface, and the lower surface of the rotary table 2. In the up position, because the gap between the upper surface of the rotary table 2 and the cleaning gas nozzle 33 is narrow, the flow rate of the $ClF_3$ gas supplied from the cleaning gas nozzle 33 becomes high, and a time for which the $ClF_3$ gas remains on the upper surface of the rotary table 2 becomes short. This makes possible to increase the rate of etching of a reaction product such as a silicon dioxide film deposited on the side surface and the lower surface of the rotary table 2. In the down position, because the gap between the upper surface of the rotary table 2 and the cleaning gas nozzle 33 is wide, the flow rate of the $ClF_3$ gas supplied from the cleaning gas nozzle 33 becomes low, and a time for which the $ClF_3$ gas remains on the upper surface of the rotary table 2 becomes long. This makes possible to increase the rate of etching of a reaction product such as a silicon dioxide film deposited on the upper surface of the rotary table 2. Thus, with the above cleaning method, it is possible to efficiently remove a reaction product such as a silicon dioxide film deposited on the side surface and the lower surface of the rotary table 2 while the rotary table 2 is kept in the up position, and to efficiently remove a reaction product such as a silicon dioxide film deposited on the upper surface of the rotary table 2 while the rotary table 2 is kept in the down position. This in turn makes it possible to reduce the cleaning time and to uniformly clean the rotary table 2.

The ratio between the first time period T1 and the second time period T2 is preferably determined based on the amount of the reaction product such as a silicon dioxide film deposited on the side surface and/or the lower surface of the rotary table 2 and the amount of the reaction product such as a silicon dioxide film deposited on the upper surface of the rotary table 2. More specifically, when the amount of the reaction product such as a silicon dioxide film deposited on the upper surface of the rotary table 2 is greater than the amount of the reaction product such as a silicon dioxide film deposited on the side surface and/or the lower surface of the rotary table 2, the second time period T2 is preferably made longer than the first time period T1. In contrast, when the amount of the reaction product such as a silicon dioxide film deposited on the side surface and/or the lower surface of the rotary table 2 is greater than the amount of the reaction product such as a silicon dioxide film deposited on the upper surface of the rotary table 2, the first time period T1 is preferably made longer than the second time period T2.

The flow rate of the $N_2$ gas supplied from the separation gas supply pipe 51 in the second cleaning process is preferably made lower than that in the first cleaning process. This decreases the flow rate of the cleaning gas that flows from the central region C of the rotary table 2 toward the first evacuation region E1 and the second evacuation region E2. This in turn increases the time for which the cleaning gas remains on the upper surface of the rotary table 2, and thereby makes it possible to efficiently remove the reaction product such as a silicon dioxide film deposited on the upper surface of the rotary table 2.

In the cleaning method of the above embodiment, the first cleaning process is performed while the rotary table 2 is in the up position, and the second cleaning process is performed while the rotary table 2 is in the down position. However, the present invention is not limited to this embodiment.

FIGS. 9A through 9E are timing charts illustrating other examples of cleaning methods according to embodiments of the present invention.

Figure 9A:
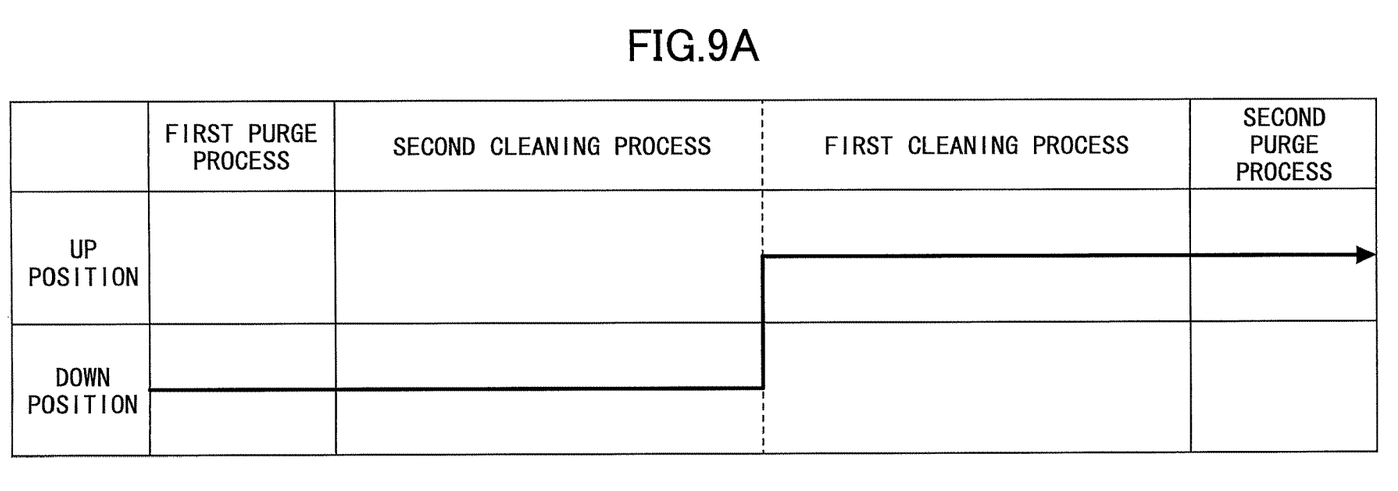
FIGS. 9A through 9E are timing charts illustrating other examples of cleaning methods.

For example, as illustrated by FIG. 9A, the first cleaning process may be performed after the second cleaning process. Here, in the first cleaning process, cleaning is performed while the rotary table 2 is kept in the up position. In the second cleaning process, cleaning is performed while the rotary table 2 is kept in the down position.

Figure 9B:
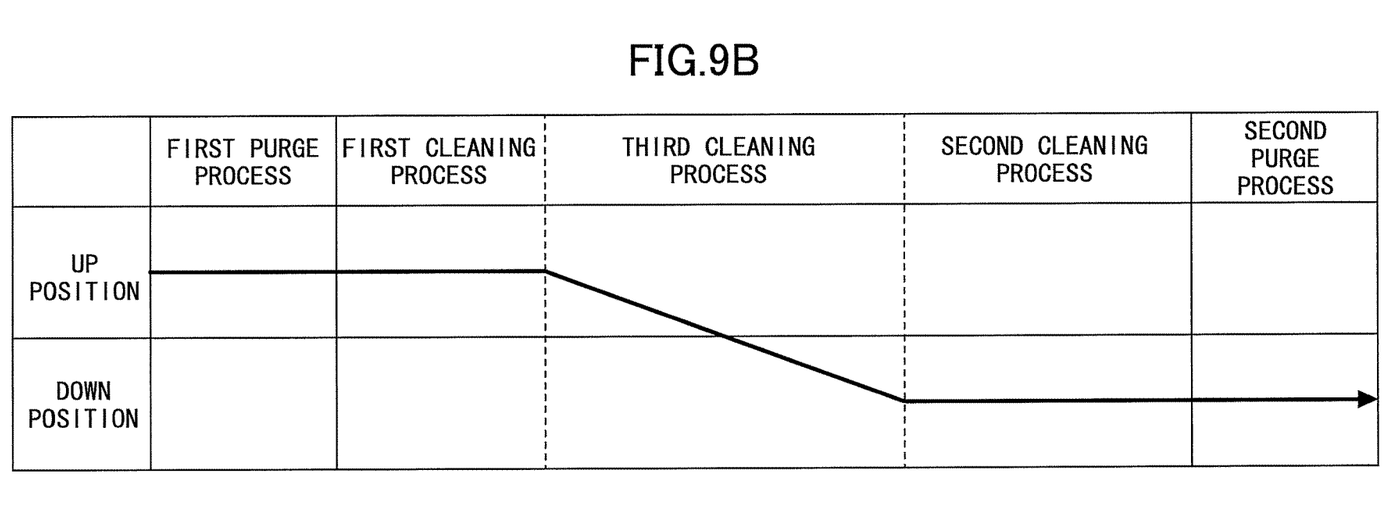

Also, as illustrated by FIG. 9B, a third cleaning process may be performed after the first cleaning process and before the second cleaning process. Here, in the third cleaning process, cleaning is performed while moving the rotary table 2 downward from the up position to the down position.

Figure 9C:
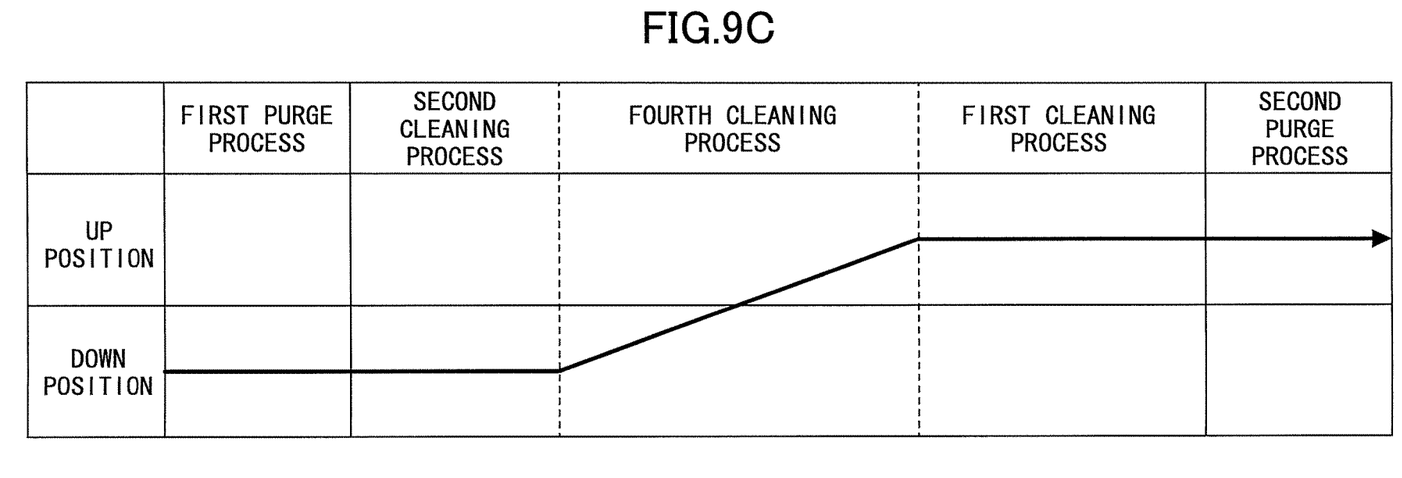

Also, as illustrated by FIG. 9C, a fourth cleaning process may be performed after the second cleaning process and before the first cleaning process. Here, in the fourth cleaning process, cleaning is performed while moving the rotary table 2 upward from the down position to the up position.

Figure 9D:
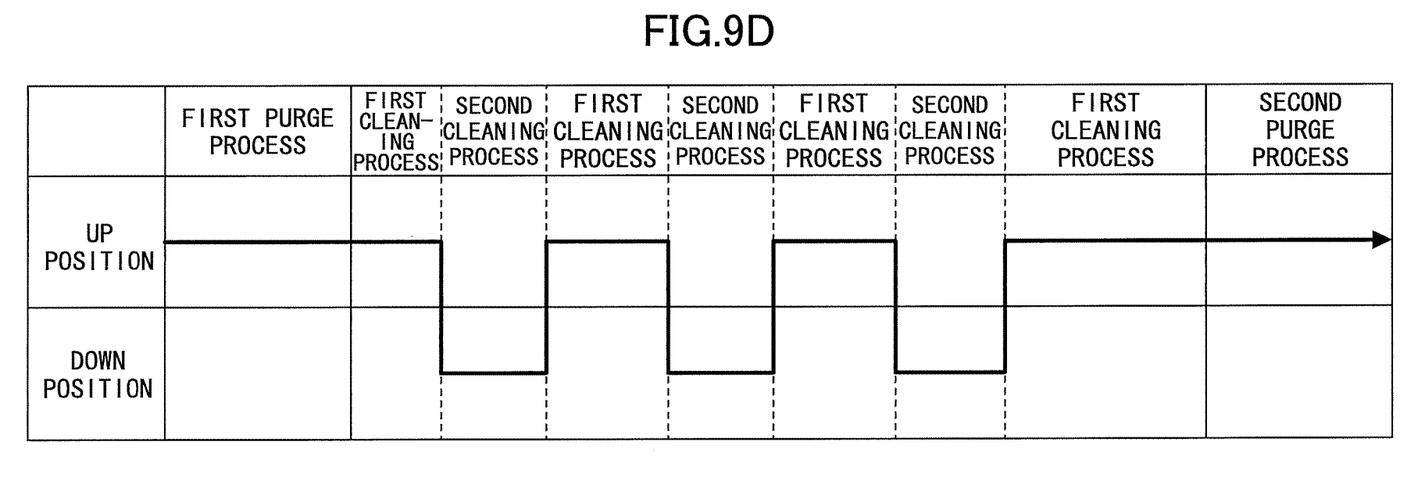

Also, as illustrated by FIG. 9D, the first cleaning process and the second cleaning process may be alternately repeated.

Figure 9E:
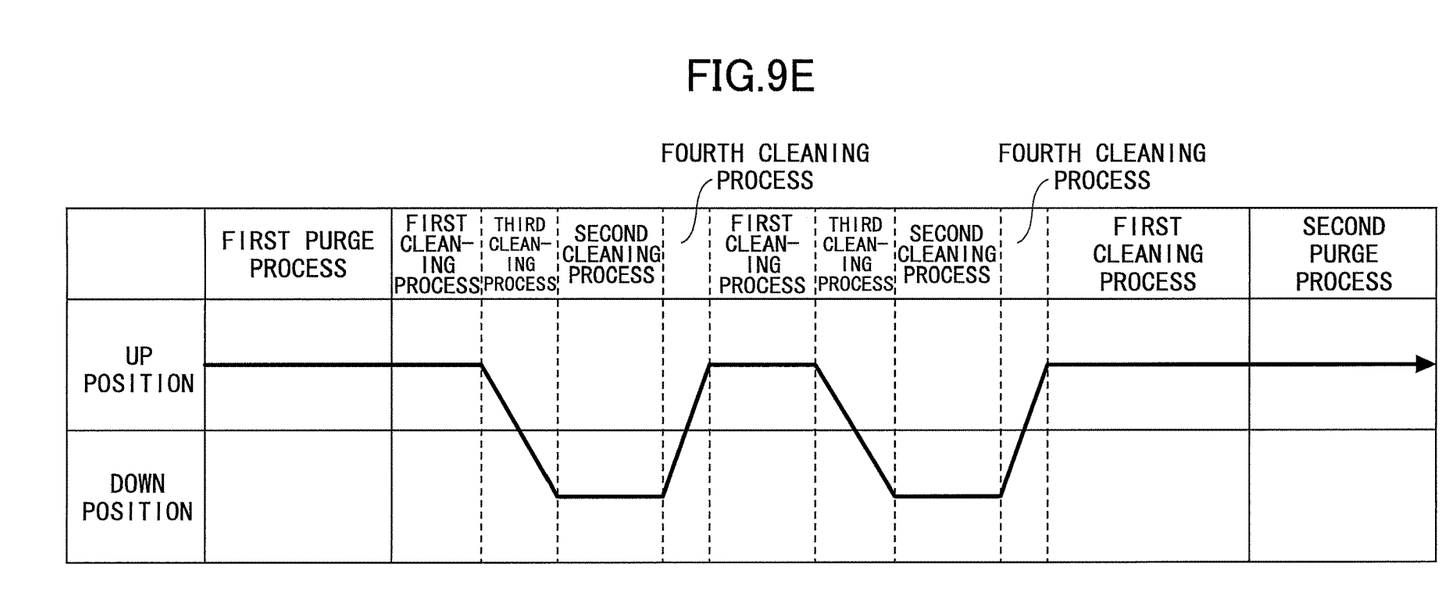

Further, as illustrated by FIG. 9E, the first cleaning process, the third cleaning process, the second cleaning process, and the fourth cleaning process may be repeated in this order.

Cleaning methods and a film deposition apparatus according to the embodiments of the present invention are described above. However, the present invention is not limited to the specifically disclosed embodiments, and variations and modifications may be made without departing from the scope of the present invention.

In the above embodiments, it is assumed that a silicon dioxide film is formed. However, the cleaning methods according to the embodiments of the present invention may also be applied to cases where other types of films are formed.

The above embodiments are described using a semi-batch-type film deposition apparatus that performs a film deposition process on multiple wafers W placed on the rotary table 2 at once. However, the present invention may also be applied to other types of film deposition apparatuses. For example, the present invention may also be applied to a batch-type film deposition apparatus that performs a film deposition process on each batch of many wafers W placed in a wafer boat at once, and to a single-wafer film deposition apparatus that performs a film deposition process on one wafer W each time.

An aspect of this disclosure provides a cleaning method and a film deposition apparatus that can reduce the cleaning time and can uniformly clean a rotary table.

What is claimed is:

1. A method performed by a film deposition apparatus including a process chamber and a rotary table that is disposed in the process chamber and includes a substrate-mounting surface on which a substrate is placeable, the method comprising:
   a first cleaning process of supplying a cleaning gas from above the substrate-mounting surface of the rotary table while rotating the rotary table in a first cleaning position; and
   a second cleaning process of supplying the cleaning gas from above the substrate-mounting surface of the rotary table while rotating the rotary table in a second cleaning position that is lower than the first cleaning position, wherein
   in the first cleaning process, the cleaning gas is supplied for a first time period;
   in the second cleaning process, the cleaning gas is supplied for a second time period; and
   a ratio between the first time period and the second time period is determined based on a ratio between a thickness of a deposit on an upper surface of the rotary table and a thickness of the deposit on a side surface or a lower surface of the rotary table.

2. The method as claimed in claim 1, wherein the second cleaning process is performed after the first cleaning process.

3. The method as claimed in claim 2, further comprising:
   a third cleaning process of supplying the cleaning gas from above the substrate-mounting surface of the rotary table while rotating the rotary table and moving the rotary table from the first cleaning position to the second cleaning position,
   wherein the third cleaning process is performed after the first cleaning process and before the second cleaning process.

4. The method as claimed in claim 1, wherein the first cleaning process is performed after the second cleaning process.

5. The method as claimed in claim 4, further comprising:
   another cleaning process of supplying the cleaning gas from above the substrate-mounting surface of the rotary table while rotating the rotary table and moving the rotary table from the second cleaning position to the first cleaning position,
   wherein the another cleaning process is performed after the second cleaning process and before the first cleaning process.

6. The method as claimed in claim 1, wherein the first cleaning process and the second cleaning process are alternately repeated.

7. The method as claimed in claim 1, further comprising:
   a third cleaning process, which is performed after the first cleaning process, of supplying the cleaning gas from above the substrate-mounting surface of the rotary table while rotating the rotary table and moving the rotary table from the first cleaning position to the second cleaning position; and
   a fourth cleaning process, which is performed after the second cleaning process, of supplying the cleaning gas from above the substrate-mounting surface of the rotary table while rotating the rotary table and moving the rotary table from the second cleaning position to the first cleaning position,
   wherein the first cleaning process, the third cleaning process, the second cleaning process, and the fourth cleaning process are repeated in this order.

8. The method as claimed in claim 1, wherein the cleaning gas includes a $ClF_3$ gas.

* * * * *